United States Patent [19]
New et al.

[11] Patent Number: 6,026,481
[45] Date of Patent: Feb. 15, 2000

[54] MICROPROCESSOR WITH DISTRIBUTED REGISTERS ACCESSIBLE BY PROGRAMMABLE LOGIC DEVICE

[75] Inventors: Bernard J. New, Los Gatos; William J. Harmon, Jr., San Jose, both of Calif.

[73] Assignee: Xilinx, Inc., San Jose, Calif.

[21] Appl. No.: 08/964,262

[22] Filed: Nov. 4, 1997

Related U.S. Application Data

[63] Continuation of application No. 08/430,968, Apr. 28, 1995.

[51] Int. Cl.$^7$ ..................................................... G06F 15/00
[52] U.S. Cl. ............................... 712/43; 326/40; 712/226; 712/229; 712/37
[58] Field of Search ...................... 326/46, 41, 40; 257/209, 202; 712/33, 34, 36, 37, 42, 43, 226, 229

[56] References Cited

U.S. PATENT DOCUMENTS

| | | | |
|---|---|---|---|
| Re. 34,363 | 8/1993 | Freeman | 307/465 |
| 4,758,985 | 7/1988 | Carter | 395/94 |
| 5,142,625 | 8/1992 | Nakai | 395/275 |
| 5,361,373 | 11/1994 | Gilson | 395/800 |
| 5,500,943 | 3/1996 | Ho et al. | 395/375 |
| 5,550,782 | 8/1996 | Cliff et al. | 365/230.03 |
| 5,552,722 | 9/1996 | Kean | 326/41 |
| 5,574,930 | 11/1996 | Haverson et al. | 395/800 |
| 5,574,942 | 11/1996 | Colewell et al. | 395/800 |
| 5,737,631 | 4/1998 | Trimberger | 712/37 |
| 5,742,180 | 4/1998 | DeHon et al. | 326/40 |
| 5,748,979 | 5/1998 | Trimberger | 712/37 |
| 5,892,961 | 4/1999 | Trimberger | 712/10 |

FOREIGN PATENT DOCUMENTS

0315275A2  11/1988  European Pat. Off. .

OTHER PUBLICATIONS

French et al.;"A Self–Reconfiguring Processor"; IEEE, 1993.

Maki et al.:"A Reconfigurable Data Path": IEEE, 1991.

Wirthlin et al.:"The Nano Processor: A Low Resource Reconfigurable Processor"; IEEE Apr. 13, 1994.

Kiaei et al.; "VLSI Design of Dynamically Reconfigurable Array Processor": IEEE, 1989.

Iseli et al; "A C ++ Compiler for FPGA Custom Execution Units Synthesis"; IEEE, 1995.

Iseli et al.; "Beyond Superscalar Using FPGAs"; IEEE, 1993.

Iseli et al.; "Spyder: A Reconfigurable VLIW Processor using FPGAs"; IEEE, 1993.

Carter; "The Future of Programmable Logic and Its Impact on Digital System Design"; IEEE, Oct. 1994.

DeHon; "DPGA–Coupled Microprocessors: Commodity ICs for the Early 21st Century"; IEEE, Apr. 1996.

Albaharna et al.; "Area and Time Limitations of FPGA–based Virtual Hardware"; IEEE, Oct. 1994.

"FPGA Implementation of a Reconfigurable Microporcessor"IEEE Proceedings, Custom Integrated Circuits Conference, San Diego, May 9–12, 1993, Published May 9, 1993, at pp. 3.2.1–3.2.4.

Book entitled *The Programmable Logic Data Book*, published in 1994 by Xilinx, Inc., 2100 Logic Drive, San Jose, CA 95124.

*The Programmable Logic Data Book*, supra, at pp. 2–109 to 2–117; 2–9 to 2–18; 2–187 to 2–199; and 2–107 to 2–108.

*Primary Examiner*—Larry D. Donaghue
*Attorney, Agent, or Firm*—E. Eric Hoffman; Jeanette S. Harms

[57] ABSTRACT

A chip includes a programmable logic device and a microprocessor, wherein at least one of the associated registers of the microprocessor is distributed in the programmable logic device. The distributed register is coupled to both the microprocessor and the programmable logic device. In this manner, the microprocessor has the ability to access the register and place a value into the programmable logic device all in one clock cycle. Additionally, the logic functions in the programmable logic device are also advantageously available to the microprocessor.

28 Claims, 10 Drawing Sheets

Prior Art

MICROPROCESSOR WITH DISTRIBUTED REGISTERS ACCESSIBLE BY PROGRAMMABLE LOGIC DEVICE

This application is a continuation of application Ser. No. 08/430,968, filed Apr. 28, 1995.

BACKGROUND OF THE INVENTION

1. Field of the Invention

The present invention relates to microprocessors, and in particular to a microprocessor having registers accessible by a programmable logic device.

2. Description of the Related Art

Figure 1:
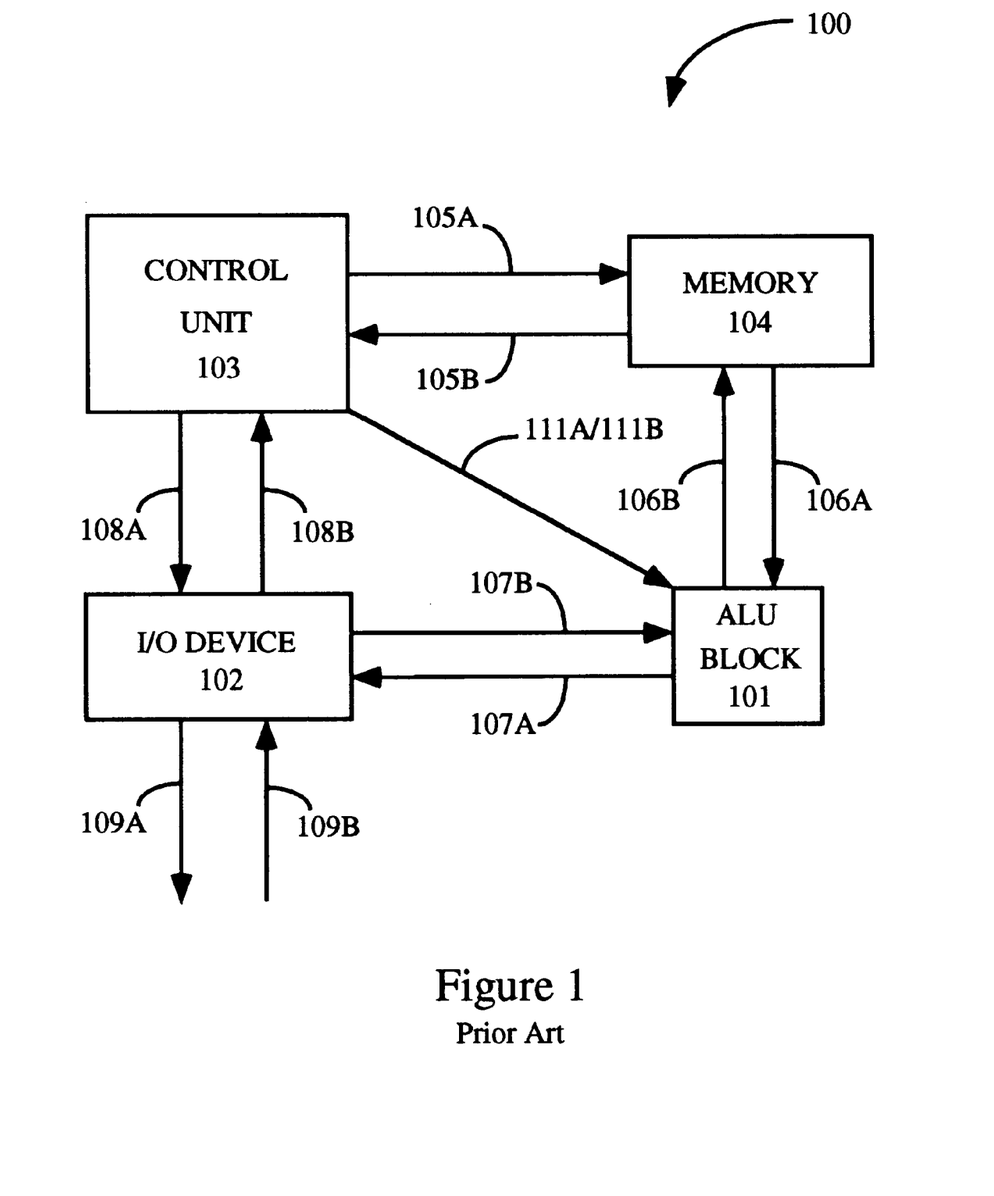
FIG. 1 illustrates a conventional configuration of a computer having a microprocessor.

Microprocessors are well known in the art. FIG. 1 illustrates a conventional configuration of a computer 100 having a microprocessor which includes an arithmetic logic unit (ALU) block 101 and a control unit 103. ALU block 101 manipulates data provided by input/output (I/O) device 102 and memory 104. I/O device 102 communicates with a user or a peripheral device (neither shown in FIG. 1) via output bus 109A and input bus 109B. In one computer, I/O device 102 communicates with a keyboard or a field programmable gate array (FPGA)(described in further detail in reference to FIG. 3). Memory 104 typically includes nonvolatile memory cells, such as electrically programmable read only memory (EPROM) cells for storing the computer program, and volatile memory cells, such as random access memory (RAM) cells for providing storage for data generated by ALU block 101. Control unit 103, relying on instructions provided in the computer program, controls the operation of ALU block 101, memory 104, and I/O device 102 via buses 111A/111B, 105A/105B, and 108A/108B, respectively.

Figure 2:
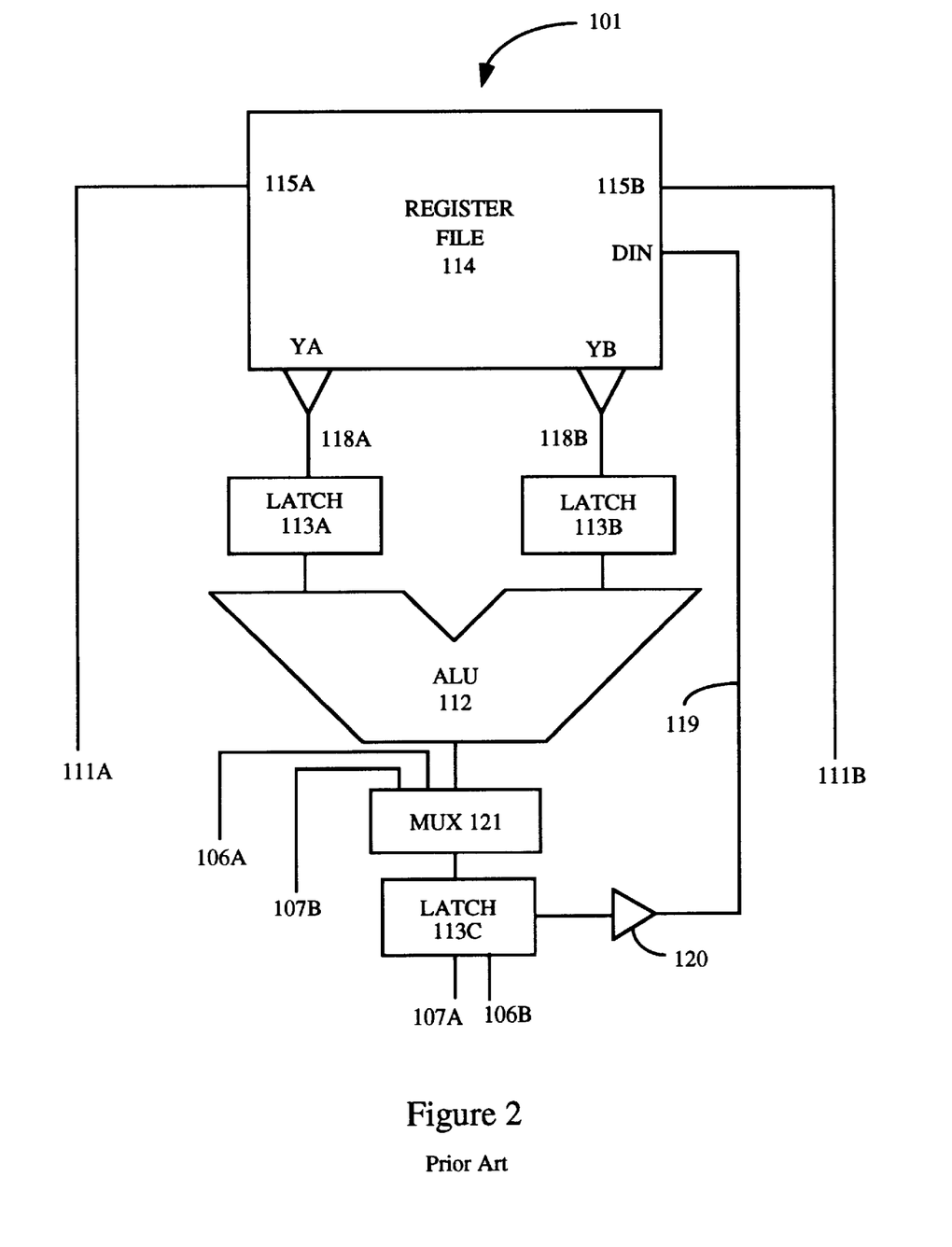
FIG. 2 shows a prior art ALU block having an associated register file.

Referring to FIG. 2, ALU block 101 typically includes an ALU 112, a register file 114, multiplexer 121, and latches 113A, 113B, and 113C. An address from controller 103 (not shown) on bus 111A is provided to an input port 115A of register file 114, thereby selecting an output signal YA at a clock signal. Similarly another address from controller 103 on bus 111B is also provided to an input port 115B of register file 114, thereby selecting a second output signal YB at the same clock signal. In this manner, output signals YA and YB are provided simultaneously at the output ports of register file 114 on output lines 118A and 118B, respectively. Latches 113A and 113B are coupled between output lines 118A and 118B, respectively, and ALU 112. Thus, latches 113A and 113B, which continuously sample their input signals and change their output signals in response to their input signals independent of the clock signal provided to register file 114 in their enabled state, transfer output signals YA and YB to ALU 112. Multiplexer 121 is programmed to transfer either the output signal from ALU 112, the output signal from memory 104 via line 106A, or the output signal from I/O device 102 via line 107B to latch 113C. Latch 113C provides output signals to I/O device 102 and memory 104 on buses 107A and 106B, respectively. Note that latch 113C also typically provides a buffered feedback signal via buffer 120 on line 119 to a data input port DIN of register file 114.

In a conventional reduced instruction set computer (RISC) processor, an operation requires three machine operating cycles (hereinafter referred to as periods). These periods are Read, ALU Operating, and Write periods. For example, during the Read period, control unit 103 (FIG. 1) retrieves an instruction from memory 104 and transfers the address portions of that instruction to register file 114 (FIG. 2) via bus 111A or bus 111B to retrieve operands on output lines 118A/118B. During the ALU operating period, the operation designated by the instruction is performed in ALU 112. Finally, during the Write period, the result is stored in register file 114 via feedback line 119 and data input port DIN. Note that the data write address is included as part of the instruction and is typically saved until needed.

The Read, ALU Operating, and Write periods are overlapping. For example, a register may perform a Write operation in one-half of one period and perform a Read operation in the other half of that period. It logically follows that periods do not correspond to specific clock cycles. Addresses are provided on buses 111A or 111B from control unit 103 as necessary.

One typical instruction to register file 114 is to add the value in a first register to the value in a second register (neither register shown), and then put the result of this summation into the second register of register file 114. In this manner, ALU block 101 operates as an accumulator. Alternatively, the value in latch 113C is written to a I/O device 102, such as an FPGA, via output bus 107A. Thus, one instruction is required to move the data, whereas another instruction is required to retrieve the result, thereby introducing considerable delay in the microprocessor and I/O device interface.

Therefore, a need arises for a structure which minimizes instructions and associated delay in the interface between the microprocessor and the I/O device.

SUMMARY OF THE INVENTION

In accordance with the present invention, a programmable logic device and a microprocessor are formed on the same chip. In one embodiment, the programmable logic device is a field programmable gate array (FPGA) having configurable logic blocks (CLBs). At least one associated register of the microprocessor is distributed in the FPGA. The distributed register remains architecturally part of the microprocessor, but is accessible by at least one CLB in the FPGA. Additionally, because each distributed register is associated with a particular configurable logic block in the FPGA, a logic function in the configurable logic block is advantageously available via the distributed register to the microprocessor. Thus, the distributed register operates as a bridge between the logic in the FPGA and the microprocessor.

In one embodiment, a distributed register includes a plurality of D flip-flops. Each flip-flop samples its input signal and changes its output signal at the rising edge of a controlling clock signal provided by the microprocessor. The output terminals of the flip-flops are coupled to a first plurality of tristate buffers. A first decoder associated with the distributed register detects whether signals provided on a first address bus match an address which identifies the distributed register. Specifically, if the first decoder detects signals on the first address bus which match the address of the distributed register, then the first decoder enables the first plurality of tri-state output buffers, thereby placing the stored register values of the plurality of D flip-flops onto a first data bus. The first address bus and the first data bus form part of a bus structure which is coupled to the microprocessor and to the FPGA. In one embodiment, the bus structure is formed separately from the interconnect matrix of the FPGA.

In accordance with the present invention, the first data bus, in addition to providing output signals to the microprocessor, also serves as an input bus. Specifically, if predetermined signals are placed on the first address bus, the first decoder disables the first plurality of tri-state buffers and a second decoder activates the clock enable terminals of the flip-flops, thereby allowing the data on the first data bus to be written into these flip-flops.

In further accordance with the present invention, the output terminals of the flip-flops are also coupled to at least one configurable logic block in the FPGA. In this manner, one advantage of the present invention is that the output signals of the distributed registers are directly available at all times to any predetermined configurable logic block. In this embodiment, these output lines are formed as part of the interconnect matrix of the FPGA.

Therefore, the first data bus and the output lines of the flip-flops ensure that the distributed register is completely accessible to the configurable logic block. In this manner, the FPGA is effectively provided with a local connection to the microprocessor. This local connection in turn ensures a fast microprocessor/FPGA interface because an instruction from the microprocessor is simultaneously provided to the configurable logic block. Similarly, a logic function provided in the configurable logic block is provided to the microprocessor within one clock cycle (i.e. determined by the first and second decoders).

In another embodiment of the present invention, the output terminals of the flip-flops are coupled to a second plurality of tri-state buffers. If a third decoder detects signals on a second address bus which match the address of the distributed register, then the third decoder enables the second plurality of tri-state buffers, thereby placing the stored register values of the plurality of flip-flops onto a second data bus. The second address bus and the second data bus also form part of the above-referenced bus structure. In yet other embodiments of the present invention, the above-referenced bus structure forms part of the FPGA interconnect matrix.

DETAILED DESCRIPTION OF THE DRAWINGS

In accordance with the present invention, a microprocessor and a field programmable gate array (FPGA) are formed on the same chip. Predetermined registers of the microprocessor are distributed in the FPGA, thereby significantly increasing the speed of operation of the microprocessor/FPGA interface in comparison to prior art interfaces.

Figure 3:
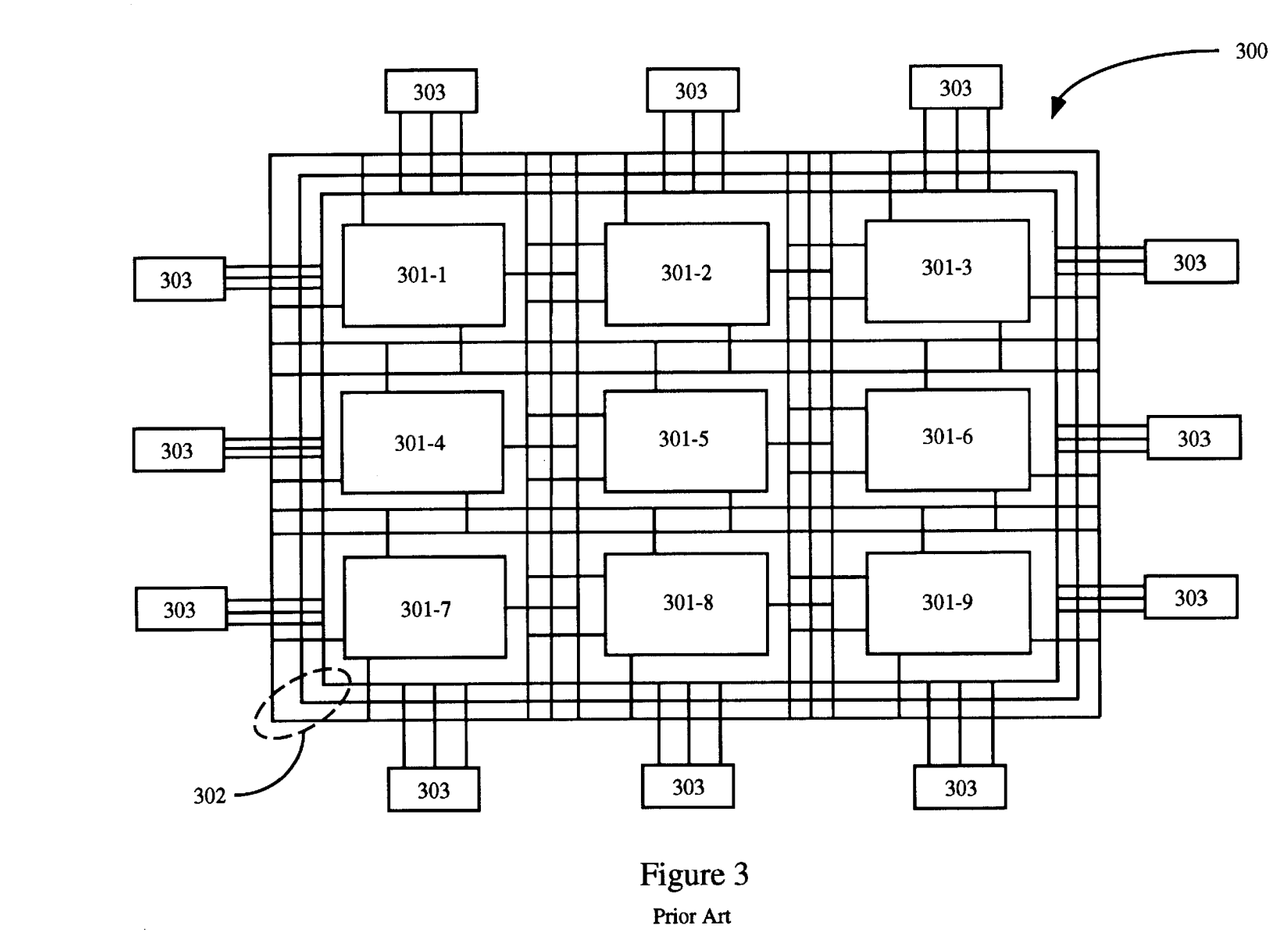
FIG. 3 illustrates a field programmable gate array (FPGA) having a plurality of configurable logic blocks.

FPGA's are well known in the art. FIG. 3 illustrates a simplified FPGA 300 having configurable logic blocks 301-1 to 301-9. Each configurable logic block (CLB) 301 is capable of performing any one of a plurality logic functions depending on the input signals CLB 301 is provided (described in further detail in reference to FIG. 4). A plurality of control signals (not shown) program an interconnect matrix 302, thereby determining the interconnection of CLBs 301-1 to 301-9 to each other and to I/O pads 303. Each I/O pad 303 provides an interface between an external package pin (not shown) and the internal logic of CLBs 301 via interconnect matrix 302. A detailed explanation of one interconnect matrix 302 and its operation is provided in U.S. Pat. Re. No. 34,363, reissued on Aug. 31, 1993 which is herein incorporated by reference in its entirety.

Figure 4:
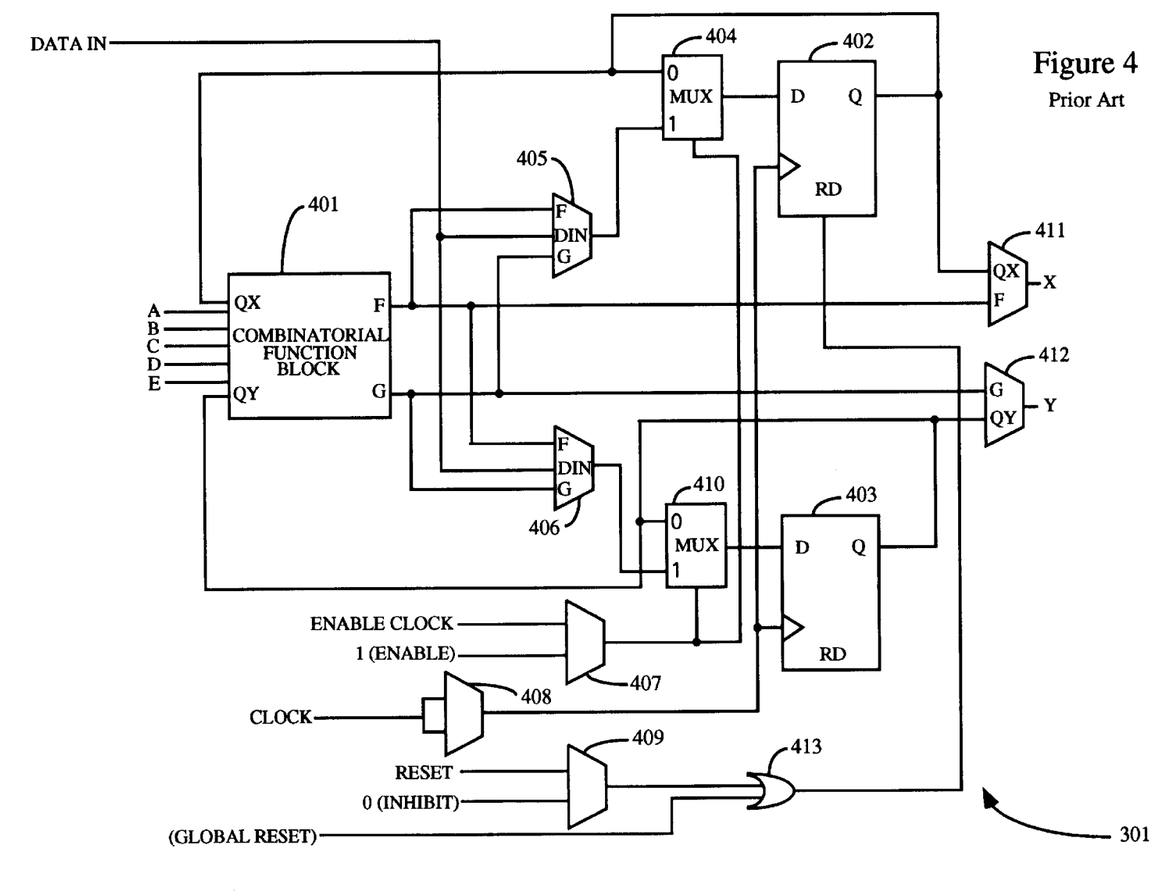
FIG. 4 shows an illustrative configurable logic block.

An illustrative configurable logic block 301 is shown in FIG. 4. In this embodiment, configurable logic block 301 includes a combinatorial function block 401 comprising a 32 by 1 look-up table to implement Boolean functions, two flip-flops 402, 403, and an internal control section (including multiplexers 404–412, and an OR gate 413). The five logic variable input signals, A, B, C, D, and E, and feedback signals QX, QY (from flip-flops 402, 403, respectively) determine which address in the look-up table is selected. The above-referenced internal control section determines whether the output signals of combinatorial function block 401, i.e. signals F and G, a data signal on line DATA IN, or output signals from flip-flops 402 and 403 are provided as output signals X and Y of configurable logic block 301. Specifically, multiplexers 411 and 412 select between providing the synchronous signals from registers 402 and 403 or the asynchronous signals from combinatorial function block 401. Multiplexers 404 and 410 determine whether the input signals provided to flip-flops 402 and 403, respectively, are derived from feedback lines, the DATA IN line, or the F or G output terminals of combinatorial function block 401 (determined by multiplexers 405 and 406). Multiplexers 404 and 410 are discussed in further detail in reference to FIG. 7. A detailed explanation of configurable logic block 301 and its operation is provided on pages 2-109 to 2-117 of "The Programmable Logic Data Book" (which is herein incorporated by reference in its entirety), published in 1994 by Xilinx, Inc. having a location at 2100 Logic Drive, San Jose, Calif. 95124.

Note that although the present invention is described in detail in reference to FPGA 300 and configurable logic block (CLB) 301, the present invention is implementable in other chip architectures and CLB configurations. For example, the present invention is equally applicable to the chip architectures and CLB configurations of the Xilinx XC4000™ family of devices (see FIG. 10) and XC2000™ family of devices which are illustrated and described on pages 2-9 to 2-18 and pages 2-187 to 2-199, respectively, of "The Programmable Logic Data Book". Supra.

Figure 5:
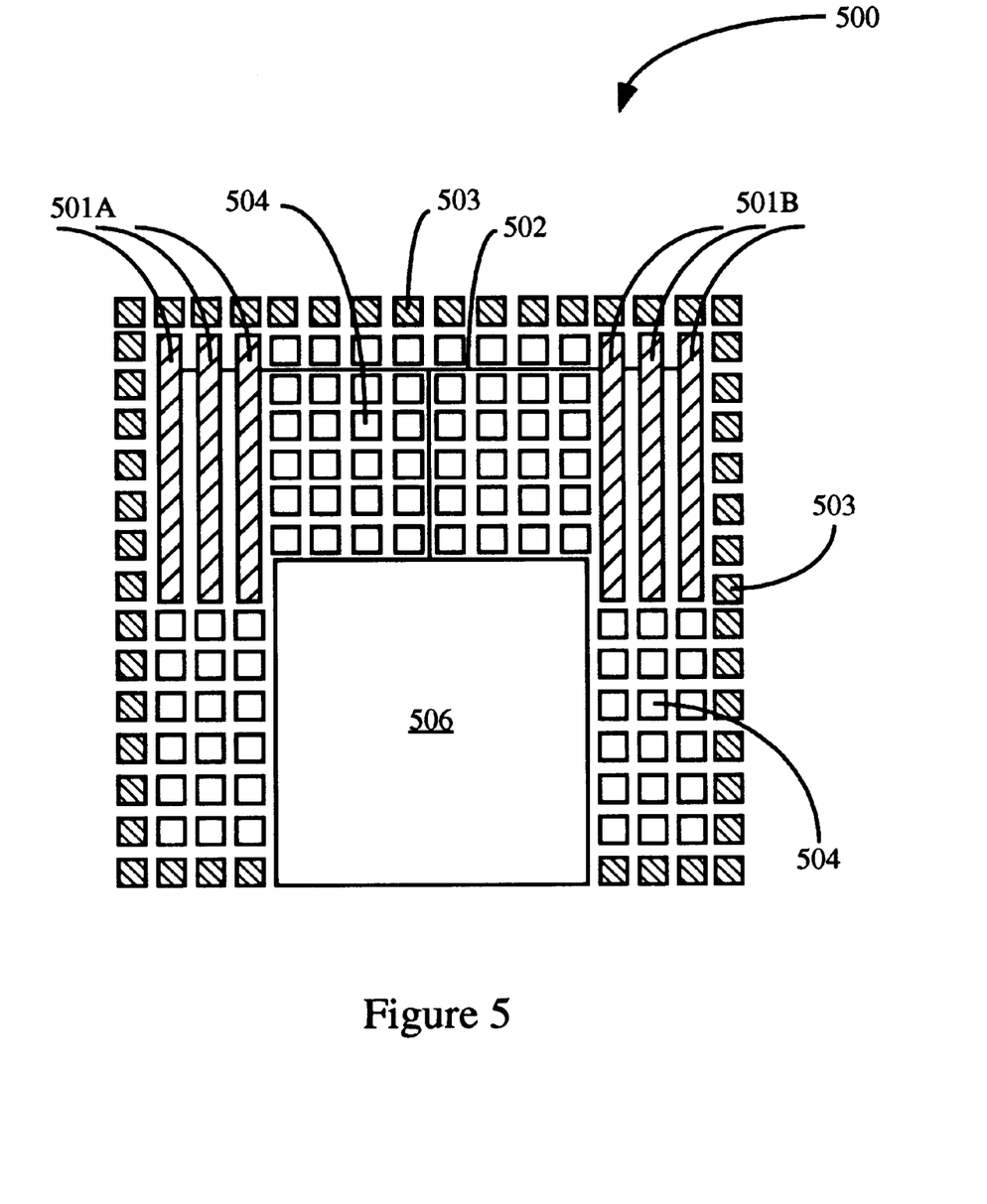
FIG. 5 illustrates an FPGA chip in accordance with the present invention including a microprocessor and a plurality of distributed registers.

FIG. 5 illustrates one embodiment of an FPGA chip 500 in accordance with the present invention. In this embodiment, FPGA chip 500 includes a microprocessor unit 506 (which, as described previously, comprises a control unit as well as an ALU block (neither shown for simplicity)), and a plurality of register blocks 501A and 501B which are distributed among CLBs 504. Thus, instead of physically locating all of register file 114 next to ALU 112 as taught in the prior art (FIG. 2), the register file is divided into a plurality of register blocks which in turn are distributed throughout chip 500.

Figure 6:
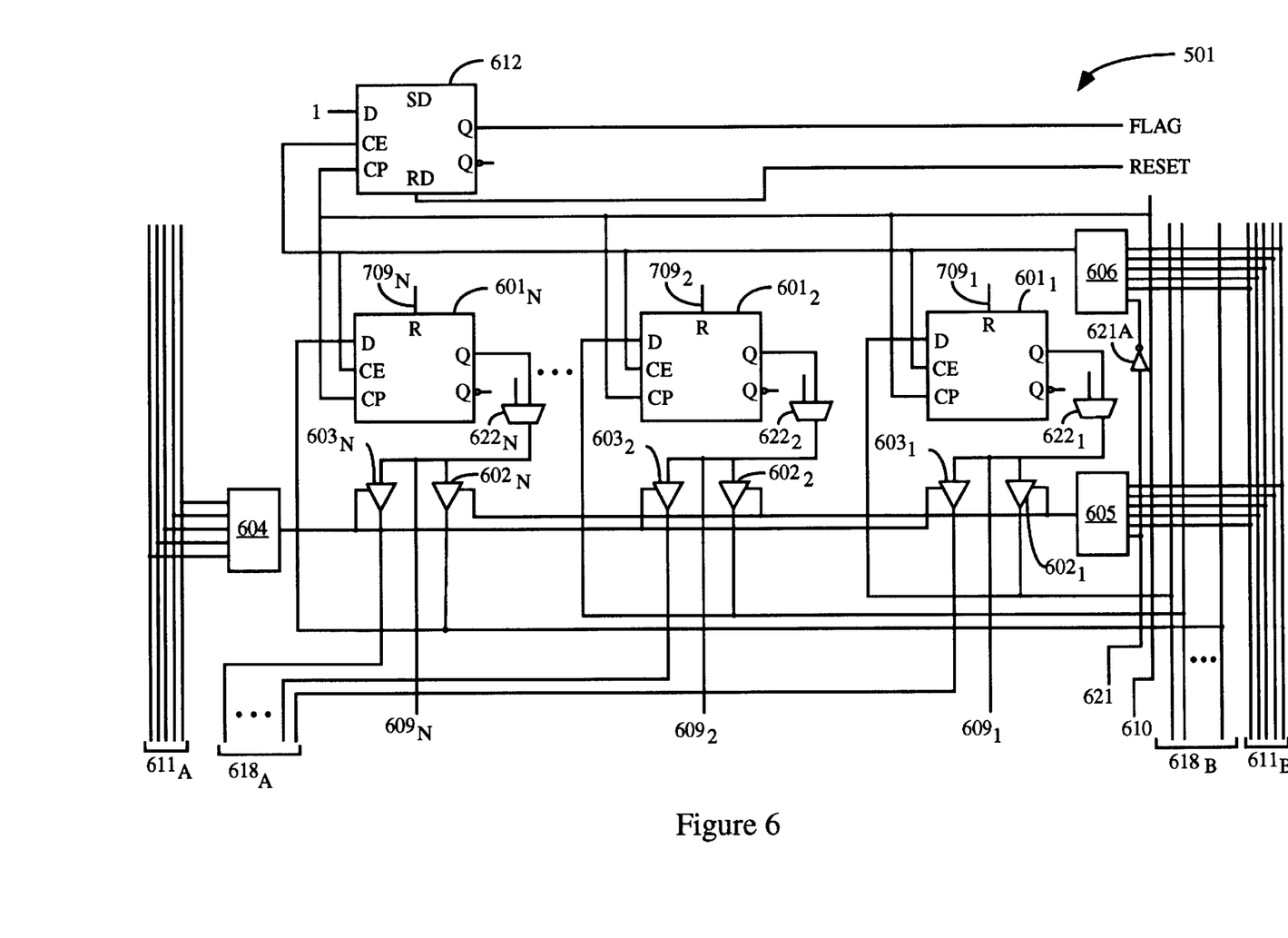
FIG. 6 shows a register block in accordance with the present invention.

A bus structure 502, which connects register blocks 501A and 501B to microprocessor unit 506, includes an address bus and a data bus (described in detail in reference to FIG. 6). In this embodiment of the present invention, both the address and data buses of bus structure 502 are formed separately from the FPGA interconnect matrix, whereas in another embodiment, both the address and data busses of bus structure 502 form part of the FPGA interconnect matrix. Chip 500 further includes a plurality of I/O blocks 503 positioned at the periphery of chip 500. I/O blocks 503 are described in detail in pages 2-107 to 2-108 of "The Programmable Logic Data Book". Supra.

FIG. 6 illustrates one embodiment of a distributed register block 501 which includes a plurality of D flip-flops $601_1$–$601_N$ (wherein N is an integer). Each flip-flop 601 is a positive edge-triggered D flip-flop that samples its input signal at the D input terminal and changes its output signal on the Q output terminal at the rising edge of a controlling clock signal provided on the clock pulse (CP) terminal. This controlling clock signal is provided by microprocessor 506 (FIG. 5) on line 610.

The WRITE operation associated with distributed register block 501 is triggered by a signal provided from microprocessor 506 via READ/WRITE (R/W) line 621 (FIG. 6). For example in one embodiment of the present invention, a low signal provided on R/W line 621 indicates a WRITE operation. This low signal provided to decoder 605 prompts that decoder to disable tri-state buffers $602_1$–$602_N$, thereby preventing any transfer of register values to data bus $618_B$. If decoder 606, in addition to detecting the high signal provided by inverter 621A in the WRITE state, also detects signals on address bus $611_B$ which match the address of register block 501, then decoder 606 provides an enabling signal to the clock enable (CE) terminal of flip-flops $601_1$–$601_N$.

Figure 7:
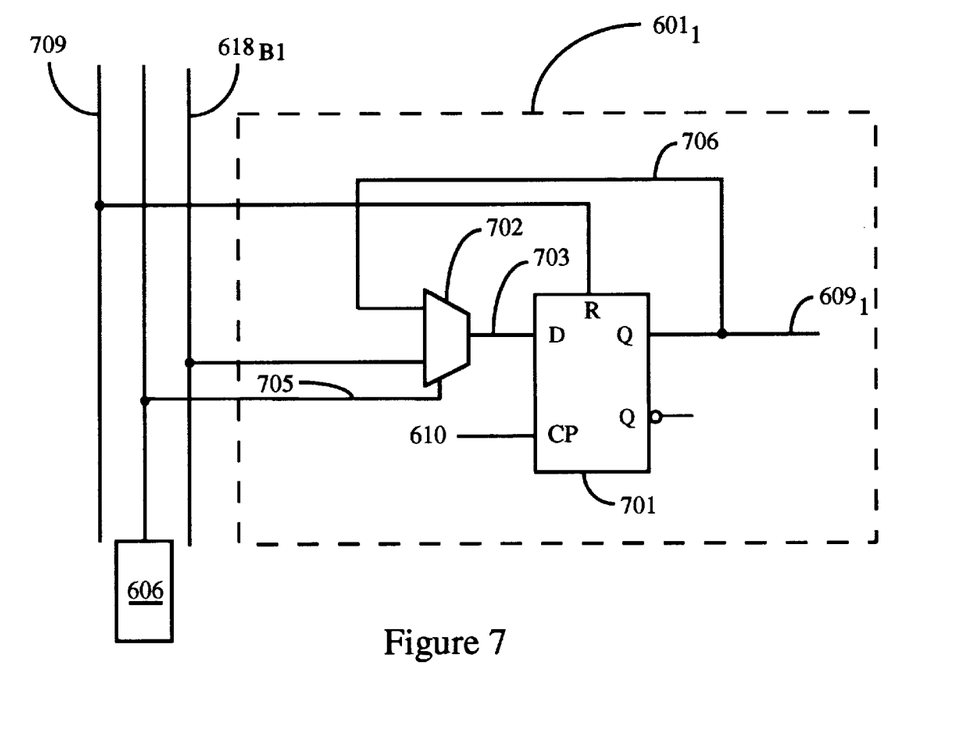
FIG. 7 shows one embodiment of a flip-flop used in the distributed register of the present invention.

FIG. 7 shows one embodiment of an illustrative flip-flop 601, i.e. flip-flop $601_1$, which includes a multiplexer 702 and a standard D flip-flop 701. If flip-flop $601_1$ receives an enabling signal, multiplexer 702 transfers the signal provided on data line $618_{B1}$ to the D input terminal of D flip-flop 701. This signal is subsequently transferred to the Q output terminal of flip-flop 701 at the next clock signal provided on line 610.

In contrast, a high signal (indicating a READ operation) on R/W line 621 (FIG. 6) is inverted by inverter 621A and provided to decoder 606. This low signal prompts decoder 606 to provide a disabling signal to the clock enable (CE) terminal of flip-flop 601. If flip-flop 601 receives a disabling signal from decoder 606 via line 705 (FIG. 7), multiplexer 702 prevents a signal from being loaded from line $618_{B1}$ into the D input terminal of D flip-flop 701. Instead, in this disabled configuration, at each clock signal on line 610, multiplexer 702 transfers the output signal on the Q output terminal of D flip-flop 701 to its D input terminal via feedback loop 706. Thus, the signal on the Q output terminal of flip-flop 701 remains constant irrespective of the signal provided on line $608_{B1}$.

Figure 8:
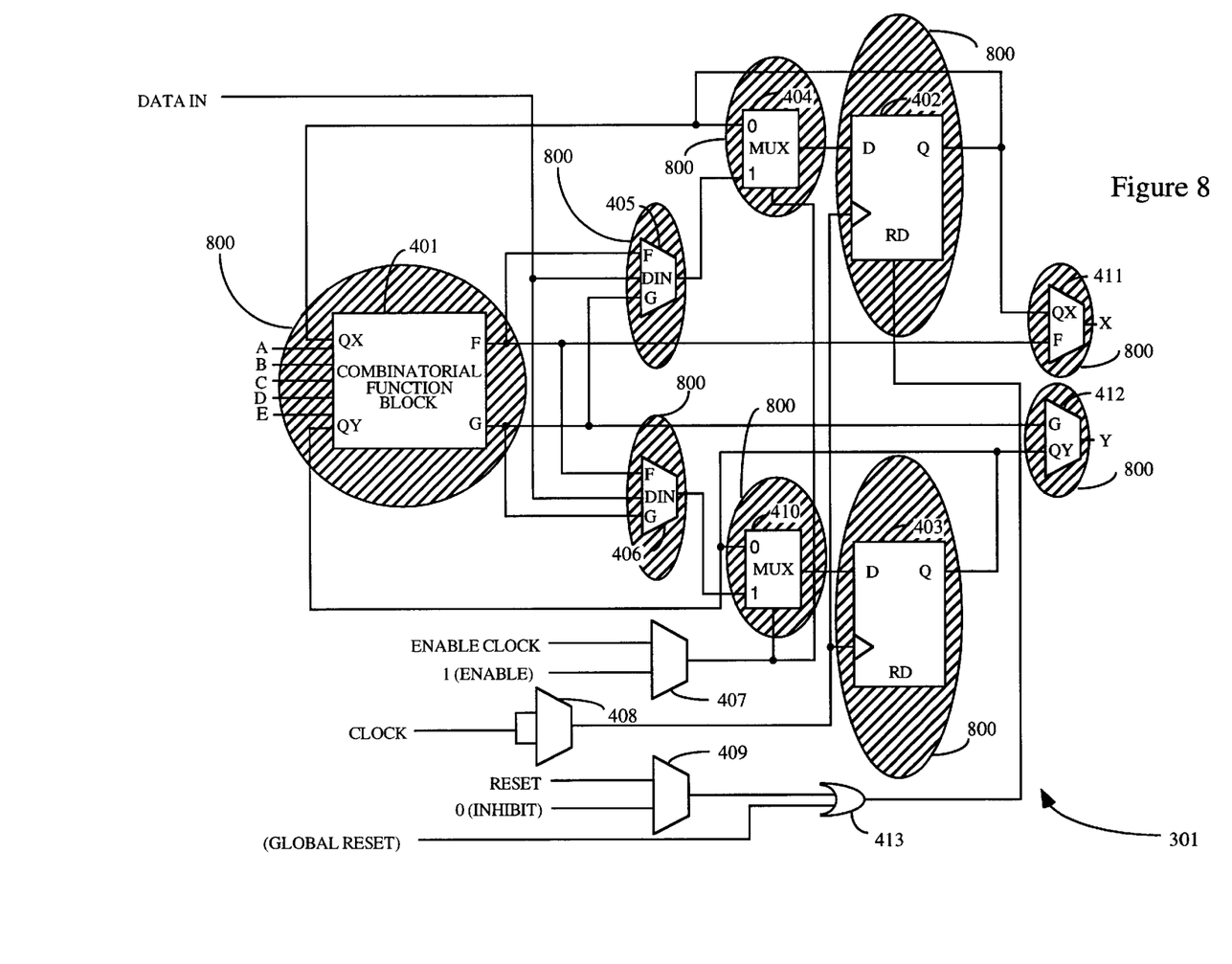
FIG. 8 illustrates various locations in a configurable logic block for connection to a distributed register.

Referring back to FIG. 6, if decoder 605 detects signals on address bus $611_B$ which match the address of distributed register block 501 and detects the high signal on line 621 (indicating a READ state), then decoder 605 enables tri-state output buffers $602_1$–$602_N$, thereby placing the stored register values on the Q output terminals of flip-flops $601_1$–$601_N$ onto data bus $618_B$ (assuming multiplexers $622_1$–$622_N$, which are explained in detail in reference to FIG. 8, are appropriately programmed). Thus, in the present invention, data bus $618_B$, in addition to providing input signals to distributed register block 501 from microprocessor 506

(FIG. 5), also serves as an output bus. Note that in one embodiment during an initial reset, flip-flops $601_1$–$609_N$ are reset by a signal provided on their reset terminals R via lines $709_1$–$709_N$, respectively. Data bus $618_B$ forms part of bus structure 502 (FIG. 5) which is coupled to microprocessor 506. Address buses $611_A$ and $611_B$ also form part of bus structure 502 of chip 500.

If decoder 604 detects signals on address bus $611_A$ which match the address of distributed register block 501, then decoder 604 enables tri-state output buffers $603_1$–$603_N$, thereby placing the stored register values on the Q output terminals of flip-flops $601_1$–$601_N$ onto data bus $618_A$ (still ignoring multiplexers $622_1$–$622_N$). Note that decoder 604 operates in a READ state irrespective of the signal on R/W line 621. Data bus $618_A$ forms part of bus structure 502 (FIG. 5) which is coupled to microprocessor 506.

Figure 9:
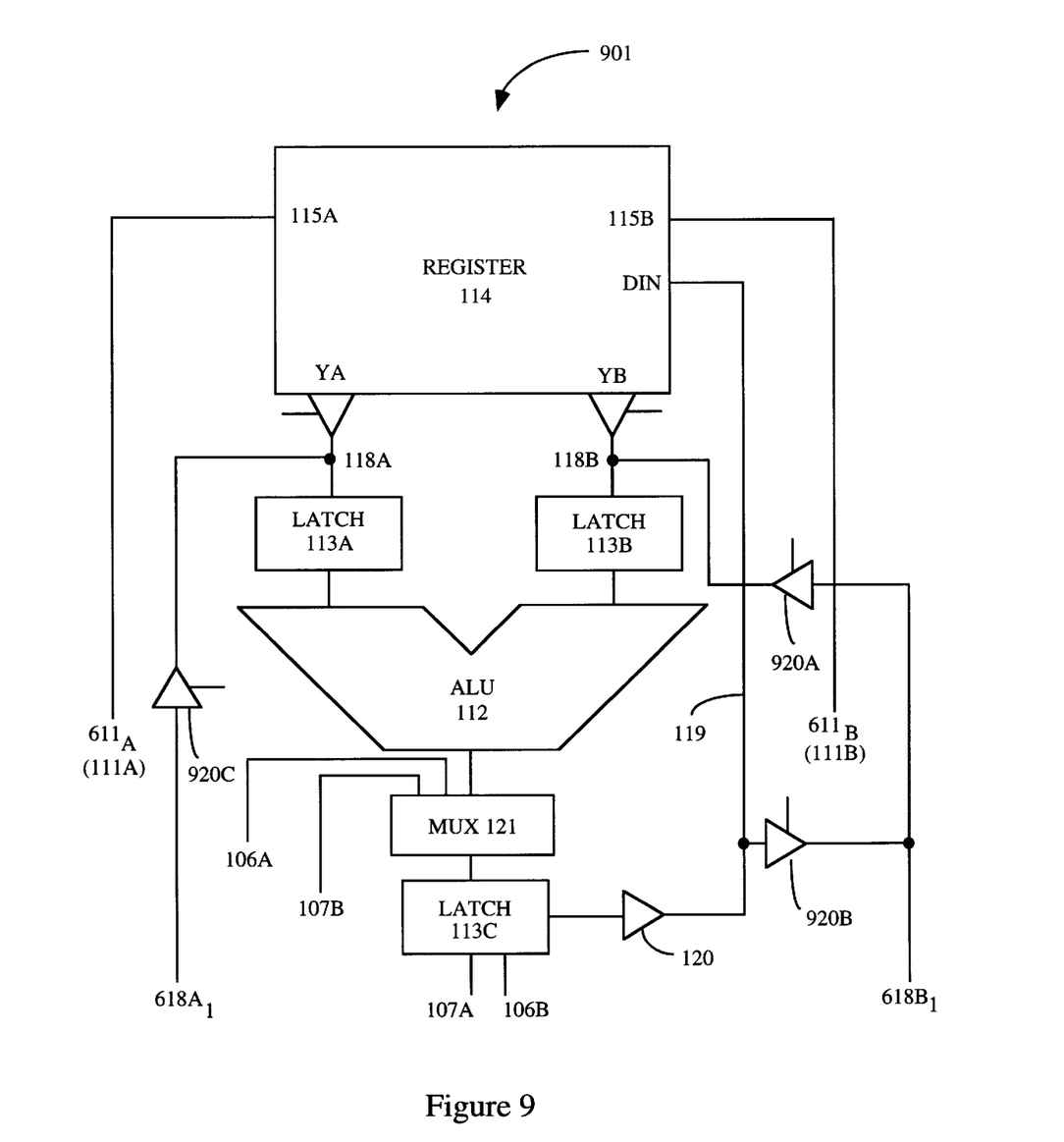
FIG. 9 shows the interconnection of the ALU block with a distributed register of the present invention.

FIG. 9 shows an illustrative interconnection of an ALU block 901 to distributed register block 501 (FIG. 6). Specifically, buses 111A and 111B from controller 103 (FIG. 1) transfer signals to buses $611_A$ and $611_B$, respectively. Thus, buses $111_A$ and $111_B$ form part of bus structure 502 (FIG. 5). Buses $611_A$ and $611_B$ in turn transfer signals to distributed register block 501 as well as ALU block 901. One of the lines of data bus $618_A$, in FIG. 9 line $618_{A1}$, is coupled to output line 118A from register file 114. Similarly, one of the lines of data bus $618_B$, in FIG. 9 line $618_{B1}$, is coupled to output line 118B from register file 114. Because of the bidirectional character of data bus $618_B$ (described in detail in reference to FIG. 6), line $618_{B1}$ is also coupled to feedback line 119 of ALU block 901. In this embodiment, tri-state buffers 920A–920C selectively allow transfer of the signals to lines 118B, $618_{B1}$, 118A, respectively. Control unit 103 (FIG. 1) controls the operation of tri-state buffers 920A–920C.

Referring back to FIG. 6, output lines $609_1$–$609_N$ of flip-flops $601_1$–$601_N$, respectively, are coupled to at least one CLB 504 on FPGA chip 500 (FIG. 5). In this embodiment, output lines $609_1$–$609_n$ form part of interconnect matrix 302 (FIG. 3), wherein one output line 609 is provided to one CLB 504 (explained in detail in reference to FIG. 8). Therefore, one advantage of the present invention is that an output signal of distributed register block 501 is available at all times to a predetermined CLB 504 (FIG. 5) and thereafter to any CLB via the general interconnect. Thus, the lines of data bus $608_B$ and output lines 609 ensure that distributed register block 501 is locally accessible to CLBs 504. In this manner, the FPGA array is effectively provided with a fast connection to microprocessor 506. This fast connection in turn ensures a fast microprocessor/FPGA interface because a signal from microprocessor 506 is simultaneously provided to a CLB 504. Similarly, a logic function provided in a CLB 504 is provided to microprocessor 506 within one clock cycle (i.e. determined by decoders 604, 605, and 606).

In one embodiment of the present invention, the FPGA and the microprocessor are asynchronous, i.e. use different clocks. Therefore, a need arises for a "handshake" that indicates data which is provided to register block 501 by the microprocessor using the microprocessor clock has in fact been received by register block 501. Flip-flop 612 receives the identical clock enable signal and clock pulse signal as are received by flip-flops 601. However, unlike flip-flops 601, flip-flop 612 receives a constant logic one on its D input terminal and provides a signal FLAG to the FPGA logic and the microprocessor. Thus, a logic one provided on the Q output terminal of flip-flop 612 indicates that the data provided by the microprocessor has been received by register block 501. To complete the handshake and to prepare for the next data transfer, the FPGA logic provides a signal RESET to flip-flop 612 to reset the value of the signal stored on the Q output terminal to zero.

Figure 10:
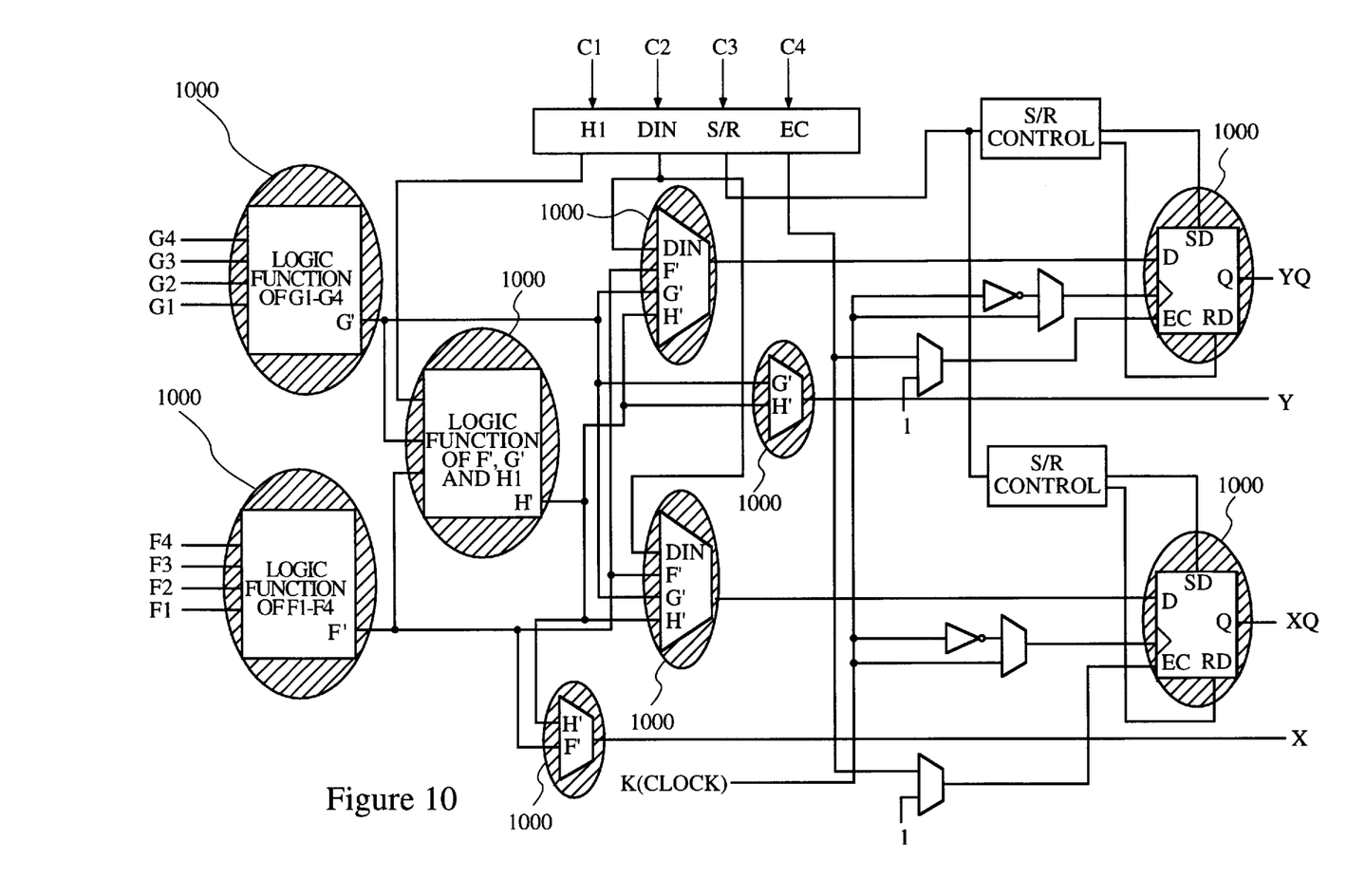
FIG. 10 shows various locations in another configurable logic block for connection to a distributed register.

FIG. 8 illustrates the locations in configurable logic block 301 which can provide connection to distributed register 501 (FIG. 6). Specifically, shaded areas 800 indicate logic elements which can be coupled to either data bus $618_B$ or output lines $609_1$–$609_N$. For example in one configuration, at least one of the Q output terminals of flip-flops 402 and 403 is coupled to data bus $618_B$ via a multiplexer 622 (FIG. 6). In another configuration, at least one of the output terminals of multiplexers 404, 405, 406, 410, 411, or 412, or the F and G output terminals of combinatorial function block 401 is coupled to data bus $618_B$ via a multiplexer 622 (FIG. 6). In yet another configuration, an output line 609 is coupled to an input terminal of either combinatorial function block 401, or to the input terminal of one of multiplexers 404, 405, 406, 410, 411, or 412 (wherein these multiplexers change in configuration from two-input to three-input multiplexers). FIG. 10 illustrates a simplified block diagram of another configuration logic block (associated with the Xilinx XC4000™ family of devices), wherein shaded areas 1000 indicate logic elements which can be coupled to either data bus $618_B$ or output lines $609_1$–$609_N$ (FIG. 6).

Note that in one embodiment, one bit of the register in the present invention is associated with the CLB (thereby implying that only one source in the CLB is selected for connection to the register), whereas in other embodiments two bits are associated with the CLB (thereby implying that two sources in the CLB are selected for connection to the register).

The present invention provides the following advantages:
1. The microprocessor is faster than prior art microprocessors because a microprocessor in accordance with the present invention executes, in a single period, specialized complex instruction implemented in FPGA logic. Therefore, programs contain fewer instructions and are executed in fewer periods.
2. Because all distributed registers are simultaneously available to the microprocessor and the FPGA, operations can be done in parallel.
3. The microprocessor has the ability to emulate logic in the FPGA. Thus, instead of having CLBs implementing logic, a software program can take certain input signals from the FPGA, combine them in the microprocessor, and then provide the results back to the FPGA. In this manner, the microprocessor may replace several function generators, thereby saving significant space on the FPGA chip.
4. The distributed registers provide for faster communication between the microprocessor and a peripheral device (through the FPGA logic). Note that in one embodiment, the peripheral device is implemented in the FPCA.

The above-described embodiments of the present invention are illustrative only and not limiting. Other embodiments will be apparent to those skilled in the art in light of the Specification and its associated figures. The present invention is set forth in the appended claims.

We claim:

1. A semiconductor chip comprising:
   a programmable logic device; and
   a microprocessor comprising a control unit and an arithmetic and logic unit (ALU) having an associated register file, wherein the register file comprises one or more registers distributed throughout the programmable logic device, each of the registers storing data, wherein the control unit writes data to the registers, and wherein the data stored by the registers is continuously provided to the programmable logic device.

2. The semiconductor chip of claim 1, wherein the programmable logic device comprises a plurality of configurable logic blocks (CLBs), wherein each of the registers is coupled to a corresponding one of the CLBs.

3. The semiconductor chip of claim 2, wherein the registers are coupled to the CLBs by programmable interconnect resources.

4. The semiconductor chip of claim 2, wherein the registers are coupled to the CLBs by dedicated interconnect resources.

5. The semiconductor chip of claim 1, wherein the programmable logic device is coupled to provide signals to the control unit.

6. The semiconductor chip of claim 1, wherein each of the registers further comprises a write decoder which stores an address associated with the particular register, and wherein the chip further comprises:
   a first data bus connecting the control unit to an input port of each of the registers;
   a first address bus connecting the control unit to the write decoder of each of the registers, wherein the control unit writes data to a register by placing the data on the first data bus, providing a write enable signal to the register, and placing an address associated with the register on the first address bus.

7. The semiconductor chip of claim 6, wherein each of the registers further comprises a first read decoder which stores an address associated with the particular register, wherein the first data bus is further connected to an output port of each of the registers and to the ALU, and wherein the first address bus is further connected to the first read decoder of each of the registers, wherein the control unit causes data to be transferred from a register to the AIU on the first data bus by placing an address associated with the register on the first address bus and providing a read enable signal to the register.

8. The semiconductor chip of claim 7, wherein each of the registers further comprises a second read decoder which stores an address associated with the particular register, and wherein the chip further comprises:
   a second data bus connecting the output port of each of the registers to the ALU;
   a second address bus connecting the control unit to the second read decoder of each of the registers, wherein the control unit causes data to be transferred from a register to the ALU on the second data bus by placing an address associated with the register on the second address bus and providing a read enable signal to the register.

9. The semiconductor chip of claim 8, wherein the second data bus also connects the control unit to an input port of each of the registers.

10. The semiconductor chip of claim 6, wherein the first data bus is also connected to the ALU, and wherein the ALU comprises a driver circuit for selectively transferring data from the ALU to the registers over the first data bus.

11. The semiconductor chip of claim 1, further comprising one or more registers of the register file being located adjacent to the ALU.

12. The semiconductor chip of claim 1, wherein the registers are accessed in response to a clock signal provided by the control unit.

13. The semiconductor chip of claim 1, wherein read accesses and write accesses of the registers are distinguished by a control signal transmitted by the control unit.

14. The semiconductor chip of claim 1, wherein each of the registers comprises a plurality of tri-state buffers for reading data from the registers.

15. The semiconductor chip of claim 14, wherein the tristate buffers are controlled by the control unit.

16. The semiconductor chip of claim 1, further comprising a plurality of input/output (I/O) blocks associated with the programmable logic device located at the periphery of the chip.

17. The semiconductor chip of claim 1, further comprising a handshake circuit for coordinating data transfer from the control unit to the programmable logic device through the registers.

18. The semiconductor chip of claim 1, wherein each of the registers comprises a plurality of flip flops.

19. A method of operating a circuit which comprises a microprocessor and a programmable logic device fabricated on the same chip, the microprocessor comprising a control unit and an arithmetic and logic unit (ALU) having an associated register file, wherein the method comprises the steps of:

distributing one or more registers of the register file throughout the programmable logic device;

writing data from the control unit to the registers; and continuously providing the data stored by the registers to the programmable logic device.

20. The method of claim 19, wherein the step of writing further comprises the steps of:

providing each of the registers with a write decoder which stores an address associated with the particular register;

placing the data on a first data bus which couples the control unit to an input port of each of the registers;

providing a write enable signal to each write decoder; and placing an address associated with a register to be written on a first address bus which couples the control unit to the write decoder of each of the registers.

21. The method of claim 19, further comprising the step of reading data stored by the registers to the ALU.

22. The method of claim 21, wherein the step of reading further comprises the step of selectively reading data stored by one of the registers to the ALU on a first data bus or a second data bus.

23. The method of claim 21, wherein the step of reading further comprises the steps of:

providing each of the registers with a first read decoder which stores an address associated with the particular register;

placing an address associated with a register to be read on a first address bus which couples the control unit to the first read decoder of each of the registers; and providing a read enable signal to each read decoder.

24. The method of claim 19, further comprising the step of transferring data stored in the registers to the control unit.

25. The method of claim 19, further comprising the step of transferring data from the ALU to the registers.

26. The method of claim 19, further comprising the step of transferring data from the programmable logic device to the control unit.

27. The method of claim 19, wherein the step of writing data is performed in response to a clock signal provided by the control unit.

28. The method of claim 19, further comprising the step of coordinating data transfer from the control unit to the programmable logic device through the registers using a handshake protocol.

* * * * *